(12) United States Patent
Pirbazari et al.

(10) Patent No.: US 11,658,646 B2
(45) Date of Patent: May 23, 2023

(54) ELECTRONIC CIRCUIT FOR TRIPLING FREQUENCY

(71) Applicant: STMicroelectronics S.r.l., Agrate Brianza (IT)

(72) Inventors: Mahmoud Mahdipour Pirbazari, Pavia (IT); Andrea Mazzanti, Modena (IT); Andrea Pallotta, Rho (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/577,292

(22) Filed: Jan. 17, 2022

(65) Prior Publication Data

US 2022/0140822 A1 May 5, 2022

Related U.S. Application Data

(63) Continuation of application No. 17/025,288, filed on Sep. 18, 2020, now Pat. No. 11,271,552.

(30) Foreign Application Priority Data

Sep. 20, 2019 (IT) .................. 102019000016871

(51) Int. Cl.
*H03K 5/00* (2006.01)
*H03K 17/60* (2006.01)

(52) U.S. Cl.
CPC ......... *H03K 5/00006* (2013.01); *H03K 17/60* (2013.01)

(58) Field of Classification Search
CPC .... H03K 5/00006; H03K 17/60; H03B 19/14; H03D 7/1458; H03D 7/12; H03D 7/1441
See application file for complete search history.

(56) References Cited

U.S. PATENT DOCUMENTS 5,552,734 A * 9/1996 Kimura .................. H03D 7/145
327/356
5,576,653 A * 11/1996 Kimura .................. G06G 7/164
327/356

(Continued)

FOREIGN PATENT DOCUMENTS

| GB | 2283347 A | 5/1995 |
| JP | H1093399 A | 4/1998 |
| WO | 2015042814 A1 | 4/2015 |

OTHER PUBLICATIONS

Mazor, N., et al., "A high suppression frequency triplet for 60-GHz transceivers," in IEEE MTT-S International Microwave Symposium, 2015, May 17-22, 2015, pp. 1-4.

*Primary Examiner* — John W Poos
(74) *Attorney, Agent, or Firm* — Slater Matsil, LLP

(57) ABSTRACT

In an embodiment, a circuit for tripling frequency is configured to receive an input voltage ($V_{in}$) having a sinusoidal shape and a base frequency. The circuit has a first and a second transistor pair that are cross-coupled, and a trans-characteristics $f(V_{in})$ approximating a polynomial nominal trans-characteristic given by $$f(V_{in}) = \left(\frac{3}{A}V_{in} - \frac{4}{A^3}V_{in}^3\right)g_m$$

where A represents an amplitude of the input voltage and $g_m$ is a transconductance of transistors of the first and second transistor pairs.

25 Claims, 4 Drawing Sheets

(56) References Cited

U.S. PATENT DOCUMENTS

| | | | | |
|---|---|---|---|---|
| 5,581,210 A | * | 12/1996 | Kimura | G06G 7/164 |
| | | | | 327/119 |
| 2009/0160502 A1 | * | 6/2009 | Lu | H03B 19/14 |
| | | | | 327/119 |
| 2011/0187420 A1 | * | 8/2011 | Kuo | H03B 19/00 |
| | | | | 327/119 |

* cited by examiner

ELECTRONIC CIRCUIT FOR TRIPLING FREQUENCY

CROSS-REFERENCE TO RELATED APPLICATIONS

This application is a continuation of U.S. patent application Ser. No. 17/025,288, entitled "ELECTRONIC CIRCUIT FOR TRIPLING FREQUENCY," and filed on Sep. 18, 2020, which claims the benefit of Italian Patent Application No. 102019000016871, filed on Sep. 20, 2019, which applications are hereby incorporated herein by reference.

TECHNICAL FIELD

The present invention relates to an electronic circuit, and in particular embodiment, to an electronic circuit for tripling frequency.

BACKGROUND

As is known, communications at millimeter-wave (mm-wave) range have drawn a lot of attention in recent years due to the wide available bandwidth yielding higher data transmission capacity. Thus, current systems use transceivers that convert the exchanged signals from the base frequency to the selected communication frequency and vice versa. To this end, the transceivers use circuitry to generate a local oscillation (LO). Design of the local oscillation transceivers is critical because many conflicting parameters, i.e., tuning range, phase noise, output power and level of spurious tones, affect the performances. Differently from what is commonly pursued at other radio frequencies, local oscillation generation with a PLL (Phase Locked Loop) circuit comprising a VCO (Voltage Controlled Oscillator) at the desired output frequency is not viable at mm-wave range. In fact, the severe impact of parasitic structures and effects in silicon technology and the low quality factor of passive components (mostly, variable capacitors) impair the achievable tuning range and phase noise. Moreover, traditional frequency dividers in the PLL cause excessive power consumption.

A more promising approach consists in providing a PLL in a lower range (e.g., in the 10-20 GHz range), where the silicon VCO features the best figure of merit, followed by a frequency multiplier chain.

Figure 1:
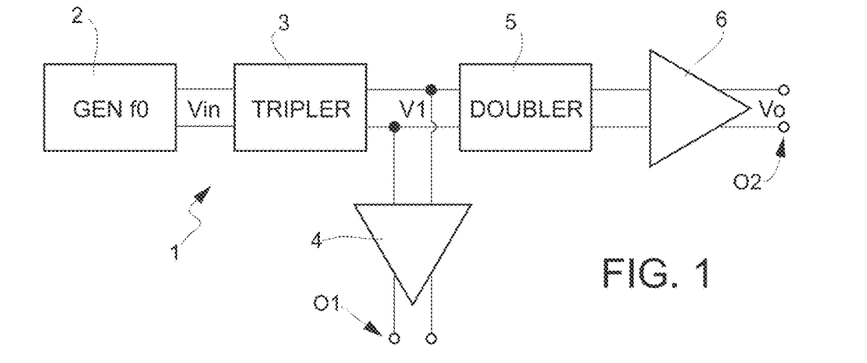
FIG. 1 shows a block diagram of the general structure of a frequency multiplier chain.

For example, FIG. 1 shows a typical frequency multiplier system 1 for obtaining a multiplication by 6, for example, for obtaining a 60 GHz voltage from a 10 GHz source. Here, a low-frequency voltage generator 2 supplies an input voltage Vin at a base frequency $f_o$, e.g., at 10 GHz, to a frequency tripler 3, which generates an intermediate voltage V1 at a triple frequency ($3f_o$). The intermediate voltage V1 is available at a first output O1 through a first buffer 4 and fed to a frequency doubler 5 that generates an output voltage Vo at output frequency $6f_o$. The output voltage Vo is made available at a second output O2 through a second buffer 6.

The frequency multiplier system 1 has to provide a good suppression of the driving signal and of undesired harmonics in order not to impair the transceiver performance. In particular, in the frequency multiplier system 1, it is desired that the first stage (frequency tripler 3) features the highest suppression, because its spurious tones are shifted close to the final LO frequencies by the intermodulation of the cascaded stages. Moreover, this issue is more critical for odd-order multipliers, because even-order multipliers (here, the frequency doubler 5) may exploit push-push transistors for suppression of signal components at undesired frequencies.

Odd-order multipliers, such as the frequency tripler 3 of the frequency multiplier system 1, typically comprise a transistor with low conduction angle (e.g., class-C biased transistor) that generates a harmonic-rich current and the desired component is selected with a band-pass filter or an injection-locked oscillator.

Figure 2:
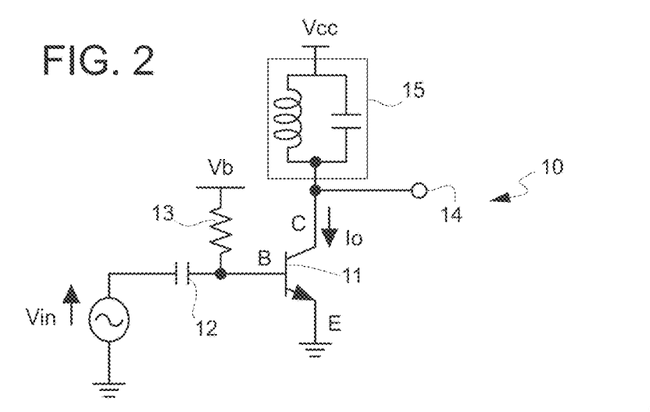
FIG. 2 is a circuit diagram of a known frequency multiplier.

For example, FIG. 2 shows the basic structure of a class-C tripler circuit, indicated by 10. The class-C tripler circuit 10 comprises a transistor 11, here of bipolar type, fed at a base terminal B by the input voltage $Vin = A \sin(2\pi f_o t)$ through an input capacitor 12 and coupled to a bias voltage Vb through a resistor 13. The transistor 11 has an emitter terminal E grounded, and a collector terminal C coupled to an output terminal 14 and to a supply voltage VCC through an LC resonant circuit 15 tuned at $3f_o$.

Figure 3A:
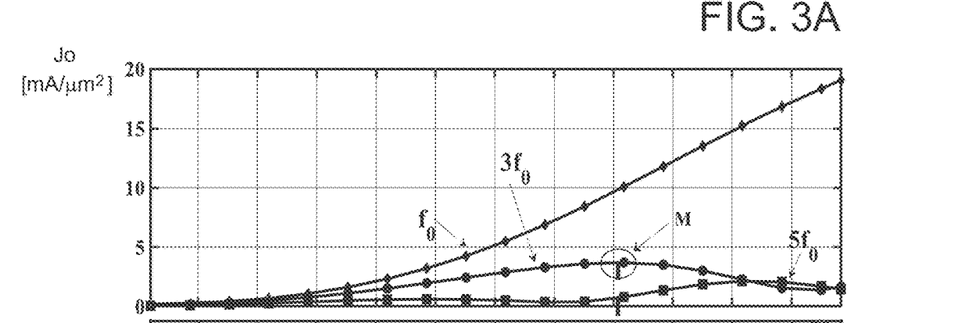
FIGS. 3A and 3B are plots of quantities related to the circuit of FIG. 2.
Figure 3B:
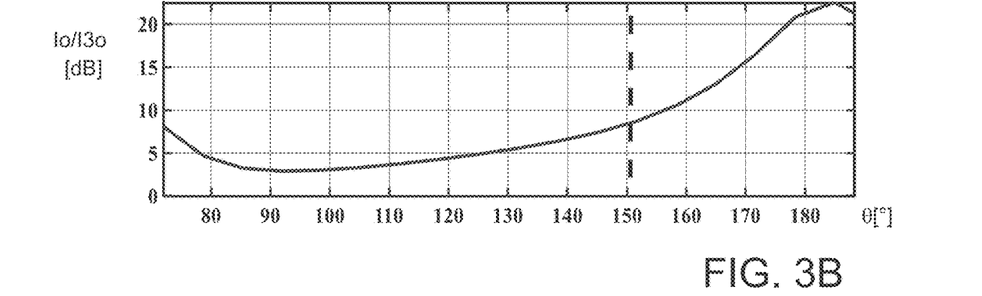

In a per se known manner, the class-C tripler circuit 10 conducts a current Io whose harmonic content is set by the conduction angle θ determined by the bias voltage Vb and shown in the simulations of FIGS. 3A and 3B.

In detail, FIG. 3A shows the plot of the output current density Jo (output current Io normalized to the area A of the transistor 11) for the fundamental ($If_o$), the third harmonic ($I3f_o$) and the fifth harmonic ($I5f_o$). FIG. 3B shows the plot of the ratio $If_o/I3f_o (=Jf_o/J3f_o)$ of the amplitudes of the normalized fundamental $Jf_o$ and the normalized third harmonic ($J3f_o$) as a function of the conduction angle θ.

As may be seen in FIG. 3A, the total harmonic rejection ratio HRR is dominated by the fundamental $Jf_o$, i.e., the leakage of the driving signal, which is always larger than the normalized third harmonic $J3f_o$. At conduction angle θ≈150°, the amplitude of normalized third harmonic $J3f_o$ is maximized (point M in FIG. 3A), but the fundamental $Jf_o$ is still 9 dB larger than the third harmonic $J3f_o$ (as also visible in FIG. 3B). Even dimensioning the LC resonant circuit 15 to maximize suppression while compromising bandwidth, the class-C tripler circuit 10 has a very poor suppression, that cannot be increased over 20 dB.

Class-C tripler circuits may be improved, in principle, by using a more complex filter topology or by cascading multiple filtering stages, but at the cost of a high design complexity, big area, bandwidth limitation and higher consumption.

Also the injection-locked oscillator solution (see, e.g., N. Mazor et al., "A high suppression frequency tripler for 60-GHz transceivers," in 2015 IEEE MIT-S International Microwave Symposium, 2015, pp. 1-4), although providing a better suppression (up to about 30 dB), does not satisfactorily solve the problem.

SUMMARY

Some embodiments provide a frequency tripler that improves the suppression of the driving signal frequency at the output.

Some embodiments relate to tripling frequency, in particular for radiofrequency applications in the millimeter-wave range.

Some embodiments relate to an electronic circuit for tripling frequency. Some embodiments related to a corresponding method.

BRIEF DESCRIPTION OF THE DRAWINGS

For the understanding of the present invention, embodiments thereof are now described, purely as a non-limitative example, with reference to the drawings, wherein.

DETAILED DESCRIPTION OF ILLUSTRATIVE EMBODIMENTS

Figure 4:
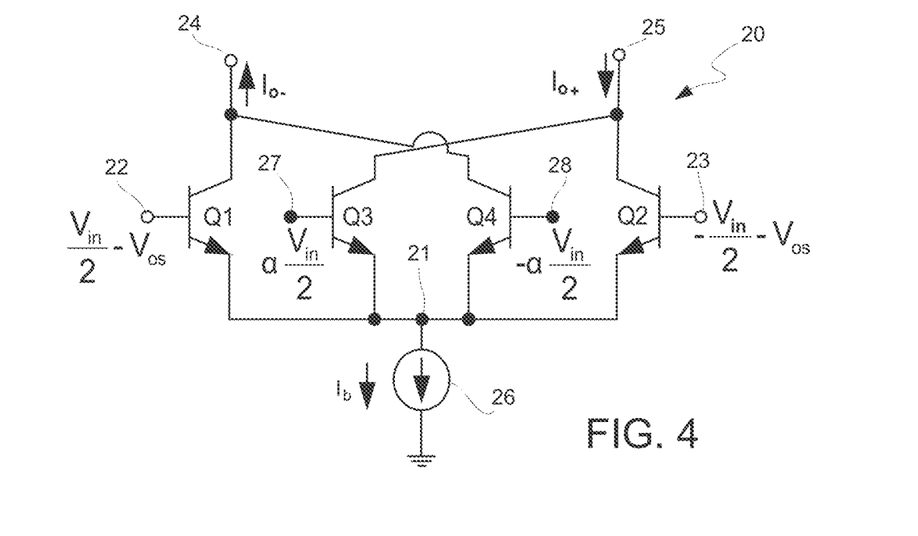
FIG. 4 is a circuit diagram of a frequency tripler, according to an embodiment of the present invention.

FIG. 4 shows a tripler circuit 20 that allows obtaining a high suppression of undesired harmonics, according to an embodiment of the present invention.

The tripler circuit 20 represents an implementation of an ideal transistor-based tripler circuit having a polynomial trans-characteristic $f(V_{in})$ (later on also called ideal polynomial trans-characteristic) according to the following equation (1):

$$f(V_{in}) = \left(\frac{3}{A}V_{in} - \frac{4}{A^3}V_{in}^3\right)g_m \quad (1)$$

where $g_m$ is the transconductance of the transistor in the tripler circuit (at a specific DC biasing condition).

In particular, as may be demonstrated with some calculation, the above ideal trans-characteristics allows a tripler circuit, receiving at its input a sinusoidal driving voltage:

$$V_{in} = A\sin(2\pi f_0 t) = A\sin(\omega_0 t)$$

having amplitude A and base frequency $f_o$ is able to generate an output current Io:

$$I_o = f(V_{in}) = g_m \sin(32\pi f_0 t) = g_m \sin(3\omega_0 t)$$

having only the third harmonic ($3f_o$).

FIG. 4 shows the structure of the tripler circuit 20 that has a trans-characteristics approximating the above polynomial trans-characteristics $f(V_{in})$, as discussed later on.

In detail, with reference to FIG. 4, the tripler circuit 20 comprises a first and a second pair of transistors, cross-coupled to each other. In particular, the first pair of transistors comprises a first and a second transistor Q1, Q2, here of the bipolar NPN-type, and the second pair of transistors comprises a third and a fourth transistor Q3, Q4, here also of the bipolar NPN-type. Transistors Q1-Q4 have same parameters, in particular same emitter area.

In detail, the first and second transistors Q1, Q2 have emitter terminals coupled to each other and to a common node 21, base terminals coupled to a first and, respectively, a second input node 22, 23 and collector terminals coupled to a first and, respectively, a second output node 24, 25 supplying a first and, respectively, a second single-ended current Io− and Io+.

The third and fourth transistor Q3, Q4 have emitter terminals coupled to each other and to the common node 21, base terminals coupled to a third and, respectively, a fourth input node 27, 28, and collector terminals coupled to the second and, respectively, the first output node 25, 24.

A biasing current source 26, configured to generate bias current $I_b$, is coupled between the common node 21 and ground.

The first and the second input nodes 22, 23 receive each a fraction equal to ½ of the input voltage $V_{in}$, in counter-phase, both reduced by a DC voltage (offset voltage $V_{os}$). The third and the fourth input nodes 27, 28 receive each an attenuation α/2 of the input voltage, in counter-phase, the attenuation α being selected so that, during operation, at low values of the input voltage $V_{in}$ and considering also the offset voltage $V_{os}$, the first pair of transistors Q1, Q2 is still off, while the second pair of transistors Q3, Q4 are on, as discussed in detail below.

Specifically, the first input node 22 receives first voltage V1:

$$V1 = V_{in}/2 - V_{os};$$

the second input node 23 receives voltage V2:

$$V2 = -V_{in}/2 - V_{os};$$

the third input node 27 receives voltage V3:

$$V3 = \alpha V_{in}/2; \text{ and}$$

the fourth input node 28 receives voltage V4:

$$V4 = -\alpha V_{in}/2$$

where $V_{os}$ is the DC offset voltage and α is the attenuation, as indicated above.

The tripler circuit 20 of FIG. 4 operates as follows. As indicated above, at small values of the input voltage $V_{in}$, the first and second transistors Q1, Q2 have low base-to-emitter biasing voltages and are off; thus the output currents $I_{o+}$ and $I_{o-}$ are governed only by the third and fourth transistors Q3, Q4, approximating equation (1). When the value of the input voltage $V_{in}$ increases, the first and second transistors Q1, Q2 turn on, subtracting current from the output nodes 24, 25. In particular, after reaching their maximum amplitudes, the output differential current $I_o = I_{o+} - I_{o+}$ reduces, reversing the slope of the trans-characteristic.

Figure 5:
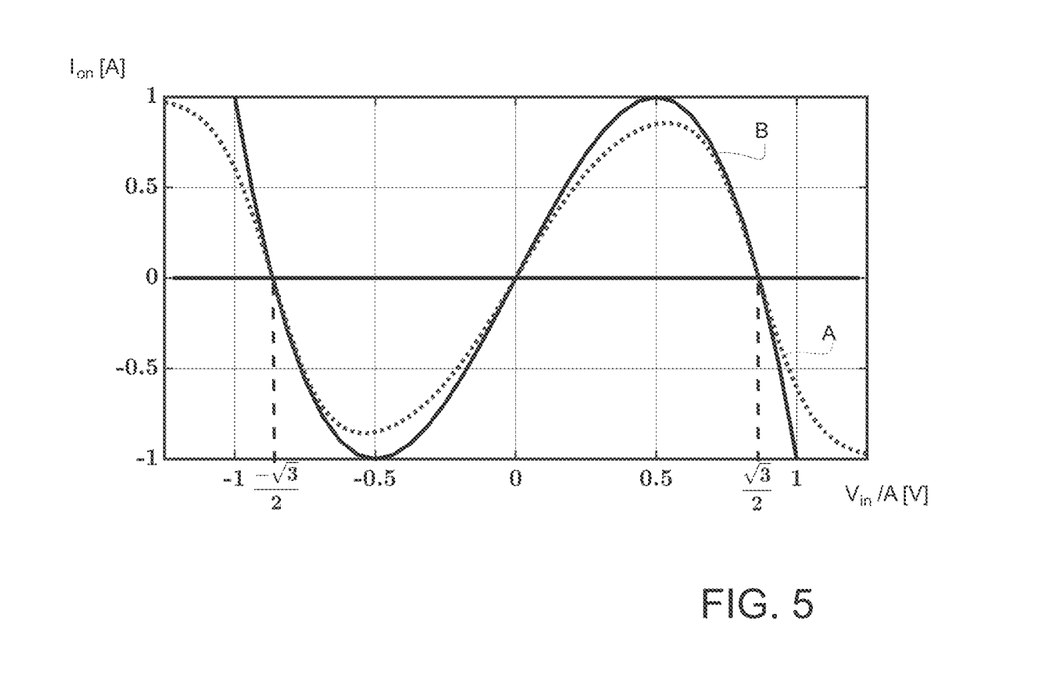
FIG. 5 shows the plot of a desired trans-characteristic and the actual characteristic of the circuit of FIG. 4, according to an embodiment of the present invention.

The trans-characteristic of the tripler circuit 20 of FIG. 4 is shown by curve A plotted in FIG. 5 with dotted line as normalized output current $I_{on}$ versus normalized input voltage $V_{in}/A$. For reference, FIG. 5 shows also the ideal trans-characteristic (1) with continuous line B.

In particular, the normalized output current $I_{on}$ is the differential current $I_{o+} - I_{o+}$, normalized with respect to its maximum amplitude (equal to $I_b$).

The values of attenuation α and offset voltage $V_{os}$ are selected so that the trans-characteristic of the tripler circuit 20 tracks the ideal polynomial trans-characteristic of equation (1), that is so that the trans-characteristic of the tripler circuit 20 is null at $V_{in}=0$, then increases with a similar slope as the ideal polynomial trans-characteristic, then decreases again to zero and to negative values, following the ideal trans-characteristic. The opposite happens for negative values of $V_{in}$.

In particular, the zero-crossings (besides of that at $V_{in}=0$) of the trans-characteristic of the tripler circuit 20 occur when the voltage at the base terminal of the third transistor Q3 (at the third input node 27) equals the voltage at the base terminal of the first transistor Q1 (at the first input node 22) as well as when the voltage at the base terminal of the fourth transistor Q4 (at the fourth input node 28) equals the voltage at the base terminal of the second transistor Q2 (at the second input node 23), that is when condition (2) is satisfied:

$$\pm \frac{V_{in}}{2} - V_{OS} = \pm \alpha \frac{V_{in}}{2}. \quad (2)$$

The zero-crossings occur thus at the following values of the input voltage $V_{in}$:

$$V_{in} = \pm \frac{2V_{OS}}{(1-\alpha)}. \quad (3)$$

On the other hand, the zero-crossings of the trans-characteristics (1) (besides of that at $V_{in}=0$) occur at the following values of the input voltage $V_{in}$:

$$V_{in} = \pm \frac{\sqrt{3}}{2} A. \quad (4)$$

It follows that the trans-characteristic of the tripler circuit 20 and the ideal trans-characteristic have same zero-crossings when attenuation α and offset voltage $V_{os}$ satisfy the following condition:

$$\frac{2V_{OS}}{(1-\alpha)} = \frac{\sqrt{3}}{2} A. \quad (5)$$

Analysis of the derivatives of the ideal polynomial trans-characteristic (1) shows that its slope at the zero crossings at $V_{in}=\pm\sqrt{3}A/2$ is ±2 times that of the origin. Further circuit analysis proves that it is enough to design attenuation α=0.2 to have the slopes of the two trans-characteristics identical at zero crossings, such that the shape of the actual trans-characteristic of the tripler circuit 20 keeps as close as possible to the ideal one (see FIG. 5). However, circuit analysis proves that a value of attenuation α comprised in the range 0.1 to 0.35 allows the trans-characteristic of the tripler circuit 20 to suitably fit the plot of the ideal polynomial trans-characteristic (1). In fact, the spread of the value of attenuation α may be compensated through the offset voltage $V_{os}$, as discussed below.

By fixing the value of attenuation α, the value of the offset voltage $V_{os}$ is obtained as a linear function of the amplitude A of the input voltage $V_{in}$, based on condition (5).

In this case, also a non-optimal value of the attenuation α may be set, and the envelope detector operates as an open loop able to compensate and maintain the linear desired relationship of condition (5).

Figure 6:
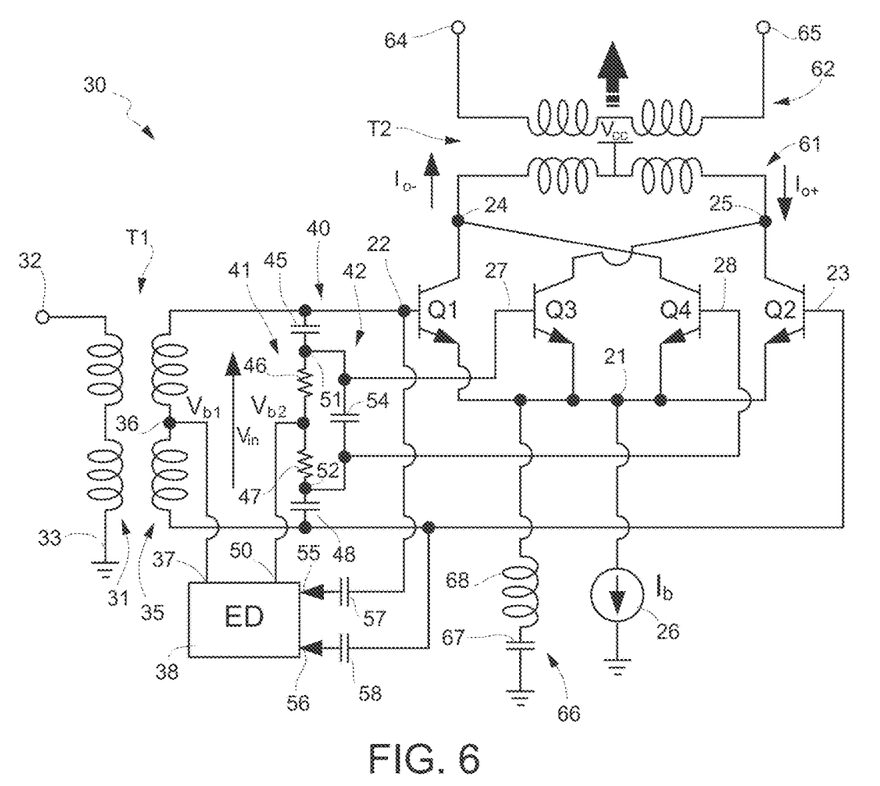
FIG. 6 is a circuit diagram of a tripler device including the circuit of FIG. 4, according to an embodiment of the present invention.

For example, FIG. 6 shows a tripler circuit, indicated by 30, comprising the tripler 20 of FIG. 5 and an envelope detector, according to an embodiment of the present invention.

In FIG. 6, an input transformer T1 has a primary winding 31 coupled between a first and a second circuit input 32, 33 and a secondary winding 35 coupled between the input nodes 22, 23 of the tripler circuit 20. The secondary winding 35 has a central tap 36 connected to a first output 37 of an envelope detector 38 and set at a first biasing voltage Vb1.

A voltage divider 40, of capacitive type, is coupled between the input nodes 22, 23 of the tripler circuit 20 and comprises a first branch 41 and a second branch 42.

The first branch 41 of the voltage divider 40 comprises a first capacitor 45, a first resistor 46, a second resistor 47 and a second capacitor 48 connected in series. The first and second capacitors 45, 48 have same capacitance C1; the first and second resistors 46, 47 have same resistance R.

The first branch 41 has a central tap between the first and second resistors 46, 47 coupled to a second output 50 of the envelope detector 38, which generates a second biasing voltage Vb2. The first branch 41 also has a first intermediate node 51 between the first capacitor 45 and the first resistor 46 and a second intermediate node 52 between the second resistor 47 and the second capacitor 48. The voltage difference Vb2-Vb1 forms the offset voltage $V_{os}$ of the tripler 20 of FIG. 5.

The second branch 42 of the voltage divider 40 comprises a third capacitor 54 coupled between the first and second intermediate nodes 51, 52. The third capacitor 54 has a capacitance C2. First and second intermediate nodes 51, 52 are also coupled to the third and, respectively, the fourth input node 27, 28 of the tripler circuit 20.

The first and second input nodes 22, 23 of the tripler circuit 20 are also coupled to a first, respectively a second input 55, 56 of the envelope detector 38 through respective capacitors 57, 58.

The tripler circuit 30 also comprises an output transformer T2 having a primary winding 61 coupled between the first and second output nods 24, 25 of the tripler 20 and a second winding 62 coupled between a first and second circuit outputs 64, 65; and an LC network 66 formed by a shunt capacitor 67 and a tail inductor 68 is coupled between the common node 21 of the tripler 20 and ground.

The first and second circuit outputs 64, 65 may be connected to an output buffer similar to the first buffer 4 of frequency multiplier system 1 of FIG. 1 and/or to a frequency multiplier such as the frequency doubler 5 of the frequency multiplier system 1 of FIG. 1.

In the tripler circuit 30 of FIG. 6, the first transformer T1 operates for line adaptation (as a balun transformer) and generates a differential signal (corresponding to input voltage $V_{in}$ of FIG. 4 and thus identified with the same reference) directly applied on the first and second input nodes 22, 23 of the tripler circuit 20 (and thus on the base terminals of the first and second transistors Q1, Q2). The differential signal $V_{in}$ is reduced by the attenuation α by the capacitive divider 40 and applied to the third and fourth input nodes 27, 28 of the tripler circuit 20 (and thus on the base terminals of the third and fourth transistors Q3, Q4).

The tail inductor 68 resonates with shunt equivalent capacitance existing at the common node 21 and the shunt capacitance 67 is sized sufficiently large to act as an AC-short at the operating frequency of common node 21, which is $2f_o$. In fact, LC network 66 allows the shunt parasitic capacitances at common node 21 to charge-discharge at high frequency using the current being exchanged with the tail inductor 68, hence not to lag behind the base voltages of the input transistors Q1-Q4 when operating at high input frequency.

Figure 7:
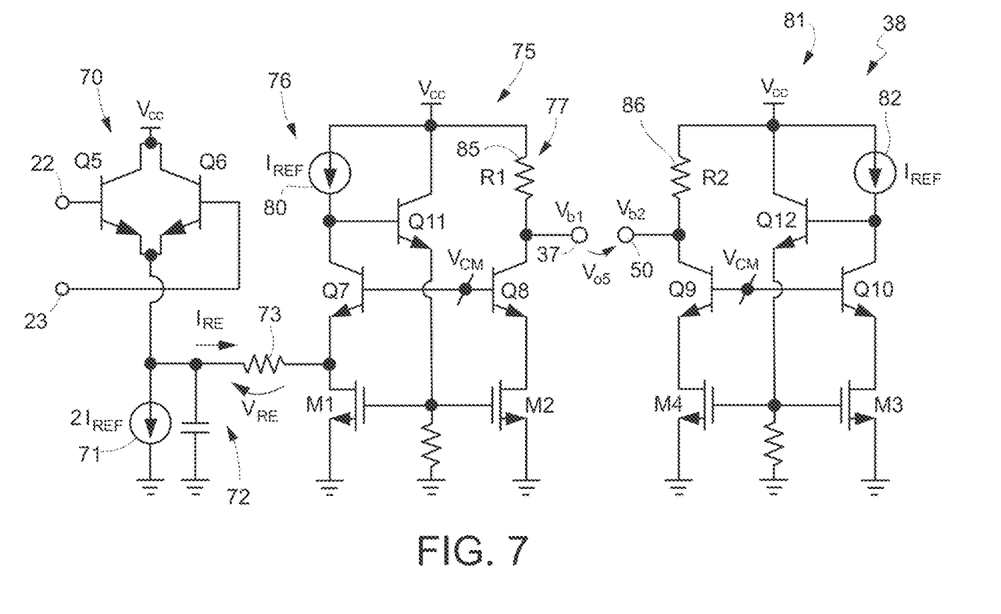
FIG. 7 is a circuit diagram of an embodiment of a block of the tripler device of FIG. 6.

FIG. 7 shows an exemplary implementation of envelope detector 38 generating the offset voltage $V_{os}$ that satisfies condition (5), according to an embodiment of the present invention.

In the specific implementation shown in FIG. 6, envelope detector 38 comprises an input differential pair 70 formed by a fifth and a sixth transistor Q5 and Q6 and driven by the input voltage $V_{in}$. A current source 71, generating a second reference current $2I_{REF}$, twice the reference current $I_{REF}$, is coupled to the emitter terminals of the fifth and sixth transistors Q5 and Q6 and to an averaging RC filter 72. The averaging filter RC 72 includes an averaging resistor 73 having resistance $R_E$ and is coupled to a first voltage generating network 75. First voltage generating network 75 comprises a first current generating branch 76 and a first current mirroring branch 77. First current generating branch 76 includes a first current source 80 generating reference current $I_{REF}$ and a transistor Q7; first current mirroring branch 77 includes a transistor Q8 that is base-coupled to transistor Q7 of the first current generating branch 76, has a collector terminal forming first output 37 of the envelope detector 38 and generates the first biasing voltage Vb1. A second voltage generating network 81, having the same basic structure of the first voltage generating network 75, has coupled transistors Q9 and Q10 and generates the second biasing voltage Vb2 at a collector of transistor Q9 coupled to the second output 50 of the envelope detector 38. The second voltage generating network 81 also includes a second current source 82 generating the reference current $I_{REF}$.

A supply voltage $V_{CC}$ is applied to the collector terminals of the fifth and sixth transistors Q5 and Q6 and to supply nodes of the first and second voltage generating networks 75, 81. Supply voltage $V_{CC}$ is also applied to a central tap of the second transformer T2.

All transistors Q5-Q10 in the envelope detector 38 share a same bias voltage $V_{CM}$. In this way, transistors Q5-Q6 (driven by $|V_{in}(t)|$) and Q7, cause the voltage $V_{RE}$ on averaging resistor 73 to be equal to the average value of $|V_{in}(t)|$. Since $V_{in}(t)=A\sin(2\pi f_o t)$, voltage on the averaging resistor 73 is $V_{RE}=(4/\pi)A$ and the current through it is $I_{RE}=(4/\pi)A/R_E$. MOSFET transistors M1, M2 in the first voltage generating network 75 mirror current $I_{REF}+I_{RE}$ into a first output resistor 85 (coupled to the first output 37 of the envelope detector 38) with resistance R1, while MOSFET transistors M3, M4 in the second voltage generating network 81 mirror current $I_{REF}$ into a second output resistor 86 with resistance R2 (coupled to the second output 50 of the envelope detector 38). Thus:

$$Vb1=V_{CC}-(I_{REF}+I_{RE})\cdot R1,$$

$$Vb2=V_{CC}-I_{REF}\cdot R2.$$

Assuming R1=R2, $$V_{os}=Vb2-Vb1=R1\cdot I_{RE}=(4/\pi)(R1/R_E)A.$$

The ratio $R1/R_E$ is designed such that $V_{os}$ satisfies condition (5), thus allowing to maintain good suppression of the fundamental frequency component independently from the amplitude of the input signal.

Figure 8:
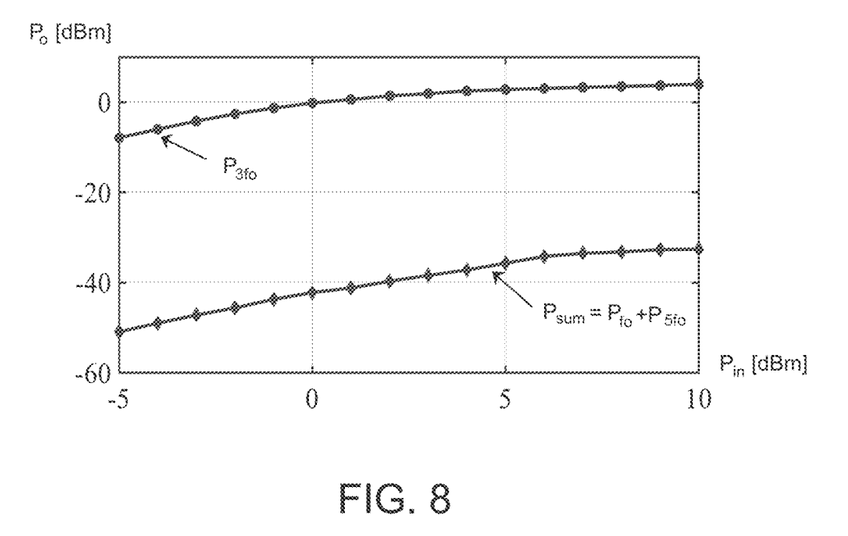
FIG. 8 shows plots of quantities related to the circuit of FIG. 4, according to an embodiment of the present invention.

Measurements made by the Applicant confirm that the tripler circuit 20 suppresses almost completely the component at fundamental frequency $f_o$ in the output current $I_o$. For example, FIG. 8 shows the plot of the output power $P_{3fo}$ measured at $3f_o$ when the input power $P_{in}$ is swept at 12.5 GHz and the plot of the sum $P_{sum}$ of the output powers $P_{fo}$ (measured at $f_o$) and $P_{5fo}$ (measured at $5f_o$) obtained with the frequency tripler 20. As may be seen, in the range −5 dBm to 10 dBm, the output power $P_{3fo}$ is higher than the sum power $P_{sum}$ of about 40 dBm in almost the entire input power range and in any case never lower than 36 dBm.

Figure 9:
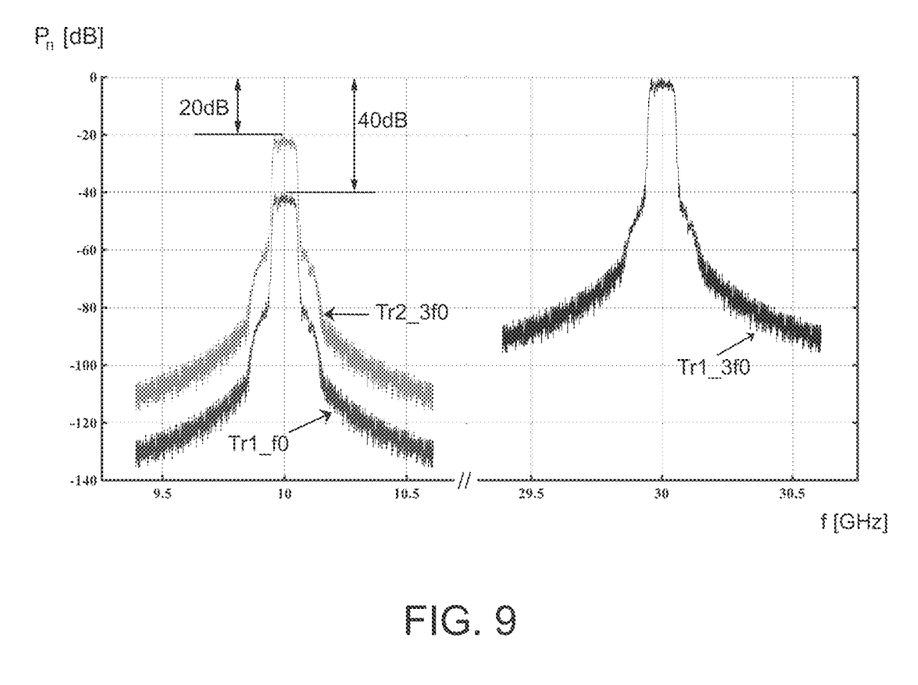
FIG. 9 shows comparative plots of the power spectrum obtained with the circuit of FIG. 4 and the circuit of FIG. 1.

The improvement of the tripler circuit 20 with respect to a conventional tripler using class-C operating transistors is also visible from FIG. 9, showing the output spectrum obtainable with the present frequency tripler 20 (curve Tr1_3fo), the undesired output spectrum at $f_o$ obtainable with a conventional tripler using class-C operating transistors (curve Tr2_fo) and the undesired output spectrum at $f_o$ obtainable with the present frequency tripler 20 (curve Tr1_fo). As visible, curve Tr1_fo is 20 dB lower than curve Tr2_fo and 40 dB lower than curve Tr1_3fo.

Advantages of embodiments of the present invention are clear from the above. For example, it is underlined that, in some embodiments, the tripler circuit is advantageously able to suppress undesired fundamental and harmonics in a much better way than with conventional circuits.

In some embodiments, the tripler circuit advantageously operates at low power compared with conventional designs exploiting class-C transistors and filters.

Finally, it is clear that numerous variations and modifications may be made to the frequency tripling electronic circuit described and illustrated herein, all falling within the scope of the invention as defined in the attached claims.

For example, the bipolar transistors Q1-Q10 could be replaced by MOSFET transistors; the transistors may be made in any technology, such as silicon, gallium arsenide (GaAs), indium phosphide (InP), etc.; the structure of the envelope detector may be any other, provided it performs the functionalities depicted above, specifically it gets Vb2−Vb1=Vos satisfying relation (5).

What is claimed is:

1. A frequency tripler circuit comprising:
first, second, third and fourth input nodes;
first and second output nodes; and
first and second transistor pairs that are cross-coupled, wherein:
the first transistor pair comprises first and second transistors having respective first and second conduction terminals and a respective control terminal,
the second transistor pair comprises third and fourth transistors having respective first and second conduction terminals and a respective control terminal,
the first conduction terminals of the first, second, third and fourth transistors are coupled together,
the second conduction terminals of the first and fourth transistors are coupled together and to the first output node,
the second conduction terminals of the second and third transistors are coupled together and to the second output node,
the control terminal of the first transistor is coupled to the first input node and is configured to receive a first fraction of an input voltage decreased by an offset voltage,
the control terminal of the second transistor is coupled to the second input node and is configured to receive a counter-phase of the first fraction of the input voltage decreased by the offset voltage,
the control terminal of the third transistor is coupled to the third input node and is configured to receive a second fraction of the input voltage, the first fraction being different from the second fraction,
the control terminal of the fourth transistor is coupled to the fourth input node and is configured to receive a counter-phase of the second fraction of the input voltage,
the input voltage has a sinusoidal shape and a base frequency, and the first and second output nodes are configured to provide an output current having sinusoidal shape and an output frequency that is a triple of the base frequency.

2. The frequency tripler circuit of claim 1, wherein the first fraction is bigger than the second fraction.

3. The frequency tripler circuit of claim 2, wherein the first fraction is 0.5 and the second fraction is between 0.1 and 0.35.

4. The frequency tripler circuit of claim 2, wherein the offset voltage satisfies $$\frac{2V_{os}}{(1-\alpha)} = \frac{\sqrt{3}}{2}A,$$

wherein $V_{OS}$ represents the offset voltage, $\alpha$ represents the second fraction, and A represents an amplitude of the input voltage.

5. The frequency tripler circuit of claim 1, further comprising an envelope detector coupled to the first and second input nodes, the envelope detector configured to generate the offset voltage.

6. The frequency tripler circuit of claim 5, further comprising:
an input transformer having a primary winding coupled between first and second input terminals and a secondary winding coupled between the first and second input nodes, the secondary winding having a central tap coupled to a first output of the envelope detector; and
a divider network coupled between the first and second input nodes and having a central tap coupled to a second output of the envelope detector.

7. The frequency tripler circuit of claim 6, wherein the divider network comprises a first branch comprising first and second resistors and first and second capacitors.

8. The frequency tripler circuit of claim 7, wherein:
the divider network comprises a second branch comprising a third capacitor coupled between the third and fourth input nodes;
the first capacitor has a first terminal coupled to the first input node and a second terminal coupled to the first resistor and to the third input node;
the second capacitor has a first terminal coupled to the second input node (23) and a second terminal coupled to the second resistor and to the fourth input node; and
the first and second resistors are coupled together at the central tap of the divider network.

9. The frequency tripler circuit of claim 6, wherein the envelope detector comprises:
an input differential pair coupled to the first and second input nodes;
a first voltage generating network coupled between the input differential pair and the first output of the envelope detector; and
a second voltage generating network coupled to the second output of the envelope detector.

10. The frequency tripler circuit of claim 1, further comprising:
an input transformer having a primary winding coupled between first and second input terminals and a secondary winding coupled between the first and second input nodes, the secondary winding having a central tap; and
a divider network coupled between the first and second input nodes, the divider network comprising:
a first capacitor coupled between an intermediate node and the first input node, and
a second capacitor coupled between the intermediate node and the second input node, wherein the offset voltage is based on a difference between a voltage at the central tap of the secondary winding of the input transformer and a voltage at the intermediate node.

11. The frequency tripler circuit of claim 1, further comprising an LC network coupled to the first and second transistor pairs, the LC network comprising a tail inductor and a shunt capacitor coupled in series.

12. The frequency tripler circuit of claim 1, wherein the first, second, third, and fourth transistors are bipolar transistors having the same emitter area.

13. The frequency tripler circuit of claim 1, further comprising a biasing current source coupled between the first conduction terminals of the first, second, third and fourth transistors and a reference terminal.

14. The frequency tripler circuit of claim 1, wherein the frequency tripler circuit has a trans-characteristic having a zero-crossing when a voltage at the first input node equal a voltage at the third input node.

15. The frequency tripler circuit of claim 1, further comprising an output transformer having a primary winding coupled between the first and second output nodes.

16. The frequency tripler circuit of claim 1, wherein:
in a first mode of operation of the frequency tripler circuit, the first and second transistors are configured to be off, and the third and fourth transistors are configured to control the output current;
in a second mode of operation of the frequency tripler circuit, the first and second transistors are configured to be on and subtract current from the first and second output nodes; and
the frequency tripler circuit is configured to switch between the first and second modes of operation based on the input voltage.

17. A frequency tripler circuit comprising:
first, second, third and fourth input nodes;
first and second output nodes;
first and second transistor pairs that are cross-coupled, wherein the first transistor pair comprises first and second transistors having respective first and second conduction terminals and a respective control terminal, wherein the second transistor pair comprises third and fourth transistors having respective first and second conduction terminals and a respective control terminal, wherein the first conduction terminals of the first, second, third and fourth transistors are coupled together, wherein the second conduction terminals of the first and fourth transistors are coupled together and to the first output node, wherein the second conduction terminals of the second and third transistors are coupled together and to the second output node, wherein the control terminal of the first transistor is coupled to the first input node, wherein the control terminal of the second transistor is coupled to the second input node, wherein the control terminal of the third transistor is coupled to the third input node, and wherein the control terminal of the fourth transistor is coupled to the fourth input node; and
a voltage divider coupled between the first and second input nodes, the voltage divider comprising a first intermediate node coupled to the third input node, and a second intermediate node coupled to the fourth input node.

18. The frequency tripler circuit of claim 17, wherein the voltage divider comprises:
   a first capacitor coupled between the first input node and the first intermediate node;
   a first resistor coupled between the first intermediate node and a third intermediate node;
   a second resistor coupled between the third intermediate node and the second intermediate node; and
   a second capacitor coupled between the second intermediate node and the second input node.

19. The frequency tripler circuit of claim 18, wherein the voltage divider further comprises a third capacitor coupled between the first and second intermediate nodes.

20. The frequency tripler circuit of claim 17, further comprising an envelope detector having a first input capacitively coupled to the first input node, a second input capacitively couple to the second input node, and a first output coupled to a third intermediate node of the voltage divider.

21. The frequency tripler circuit of claim 20, wherein the envelope detector comprises:
   an input differential pair having fifth and sixth transistors having respective control terminals respectively coupled to the first and second inputs of the envelope detector;
   a first voltage generating network having an output coupled to the first output of the envelope detector;
   a second voltage generating network having an output coupled to a second output of the envelope detector, the second output of the envelope detector being coupled to the first and second input nodes; and
   an RC filter coupled between an output of the input differential pair and an input of the second voltage generating network.

22. The frequency tripler circuit of claim 21, wherein:
   the envelope detector further comprises a first current source coupled to the output of the input differential pair;
   the first voltage generating network comprises:
      a seventh transistor having a conduction path coupled to the first output of the envelope detector,
      an eighth transistor having a control terminal coupled to a control terminal of the seventh transistor,
      a ninth transistor having a conduction path coupled to the conduction path of the seventh transistor,
      a tenth transistor having a conduction path coupled to a conduction of the eighth transistor and a control terminal coupled to a control terminal of the ninth transistor, and
      an eleventh transistor having a control terminal coupled to the conduction path of the eighth transistor and a conduction path coupled to the control terminals of the ninth and tenth transistors; and
   the second voltage generating network comprises:
      a twelfth transistor having a conduction path coupled to the second output of the envelope detector,
      a thirteenth transistor having a control terminal coupled to a control terminal of the twelfth transistor,
      a fourteenth transistor having a conduction path coupled to the conduction path of the twelfth transistor,
      a fifteenth transistor having a conduction path coupled a conduction path of the thirteenth transistor, and a control terminal coupled to a control terminal of the fourteenth transistor, and
      a sixteenth transistor having a control terminal coupled to the conduction path of the thirteenth transistor and a conduction path coupled to the control terminals of the fourteenth and fifteenth transistors.

23. The frequency tripler circuit of claim 22, wherein the fifth, sixth, seventh, eighth, eleventh, twelfth, thirteenth, and sixteenth transistors are bipolar transistors, and wherein the ninth, tenth, fourteenth, and fifteenth transistors are metal-oxide semiconductor field effect transistors (MOSFETs).

24. A method for tripling frequency, the method comprising:
   receiving an input voltage having a sinusoidal shape and a base frequency; and
   applying the input voltage to a tripler circuit comprising first and second transistor pairs that are cross-coupled, wherein the first transistor pair comprises a first and second transistors having respective first and second conduction terminals and a respective control terminal, wherein the second transistor pair comprises third and fourth transistors having respective first and second conduction terminals and a respective control terminal, wherein the first conduction terminal of the first, second, third and fourth transistors are coupled to a common node, wherein the second conduction terminal of the first and fourth transistors are coupled to a first output node, and wherein the second conduction terminal of the second and third transistors are coupled to a second output node, and wherein applying the input voltage to the tripler circuit comprises:
      applying a first fraction of the input voltage decreased by an offset voltage to the control terminal of the first transistor,
      applying a counter-phase of the first fraction of the input voltage decreased by the offset voltage to the control terminal of the second transistor,
      applying a second fraction of the input voltage to the control terminal of the third transistor, the first fraction being different from the second fraction, and
      applying a counter-phase of the second fraction of the input voltage to the control terminal of the fourth transistor; and
   generating an output current having sinusoidal shape and an output frequency that is a triple of the base frequency, wherein generating the output current comprises generating a first single-ended current at the first output node and generating a second single-ended current at the second output node.

25. The method of claim 24, wherein, in a first mode of operation of the tripler circuit, the first and second transistors are off and the first and second single-ended currents are governed by the third and fourth transistors, wherein, in a second mode of operation of the tripler circuit, the first and second transistors are on, the method further comprising selecting between the first and second modes of operation based on the input voltage.

* * * * *

UNITED STATES PATENT AND TRADEMARK OFFICE
CERTIFICATE OF CORRECTION

PATENT NO. : 11,658,646 B2
APPLICATION NO. : 17/577292
DATED : May 23, 2023
INVENTOR(S) : Pirbazari et al.

It is certified that error appears in the above-identified patent and that said Letters Patent is hereby corrected as shown below:

In the Claims

Claim 4, Column 9, Line 18; delete "a" and insert -- α --.

Signed and Sealed this
Eighteenth Day of July, 2023

Katherine Kelly Vidal
*Director of the United States Patent and Trademark Office*